United States Patent [19]
Cipolla et al.

[11] Patent Number: 5,394,121
[45] Date of Patent: Feb. 28, 1995

[54] WIRING TOPOLOGY FOR TRANSFER OF ELECTRICAL SIGNALS

[75] Inventors: Thomas M. Cipolla, Katonah; Paul W. Coteus, Yorktown, both of N.Y.; William R. Hardell, Jr., Austin, Tex.

[73] Assignee: International Business Machines Corporation, Armonk, N.Y.

[21] Appl. No.: 137,529

[22] Filed: Oct. 15, 1993

[51] Int. Cl.$^6$ ............................................... H01P 5/12
[52] U.S. Cl. ................................. 333/124; 333/125; 333/128
[58] Field of Search ............... 333/100, 124, 125, 127, 333/128, 136

[56] References Cited

U.S. PATENT DOCUMENTS

| | | | |
|---|---|---|---|
| 2,877,427 | 3/1959 | Butler | 333/128 |
| 3,832,575 | 8/1974 | Dasgupta et al. | 307/208 |
| 4,251,784 | 2/1981 | Luetzelschwab et al. | 333/128 X |
| 4,532,419 | 7/1985 | Takeda | 335/492 |
| 4,601,018 | 7/1986 | Baum et al. | 365/189 |
| 4,626,804 | 12/1986 | Risher et al. | 333/22 R |
| 4,647,877 | 3/1987 | Thompson | 333/22 R |
| 4,681,549 | 7/1987 | Peterson | 439/181 |
| 4,697,858 | 10/1987 | Balakrishnan | 439/61 |
| 4,747,783 | 5/1988 | Bellamy et al. | 439/59 |
| 4,748,426 | 5/1988 | Stewart | 333/22 R |
| 5,109,168 | 4/1992 | Rusu | 333/136 X |

*Primary Examiner*—Paul Gensler
*Attorney, Agent, or Firm*—Wayne P. Bailey; Mark E. McBurney

[57] ABSTRACT

Wiring topology and hierarchy of transmission line impedances for connecting I/O of semiconductor devices together. This arrangement gives smooth signal shapes for signal rise and fall times as fast as one (1) nsec or faster. The design uses a balanced multi-way branched net with increasing impedance until very close to the end, of the net, where it is a balanced multi-way branched net with unterminated ends. Thus, coming out of the signal driver is a single impedance transmission line. This single impedance transmission line (A) then branches into two impedance transmission lines (B), each having an impedance higher than the single line impedance that feeds it. These lines (B) are used to drive electronic modules. After entering the electronic modules through a connector, each of these lines (B) then branch into two transmission lines (C) having a yet higher impedance value. Each of these lines (C) finally ends in a cluster of four transmission lines (D). Each of these final lines (D) connects to electronic devices on the electronic module.

7 Claims, 6 Drawing Sheets

Schematic of Two HS-SIMMs With Common Address/Control Driver

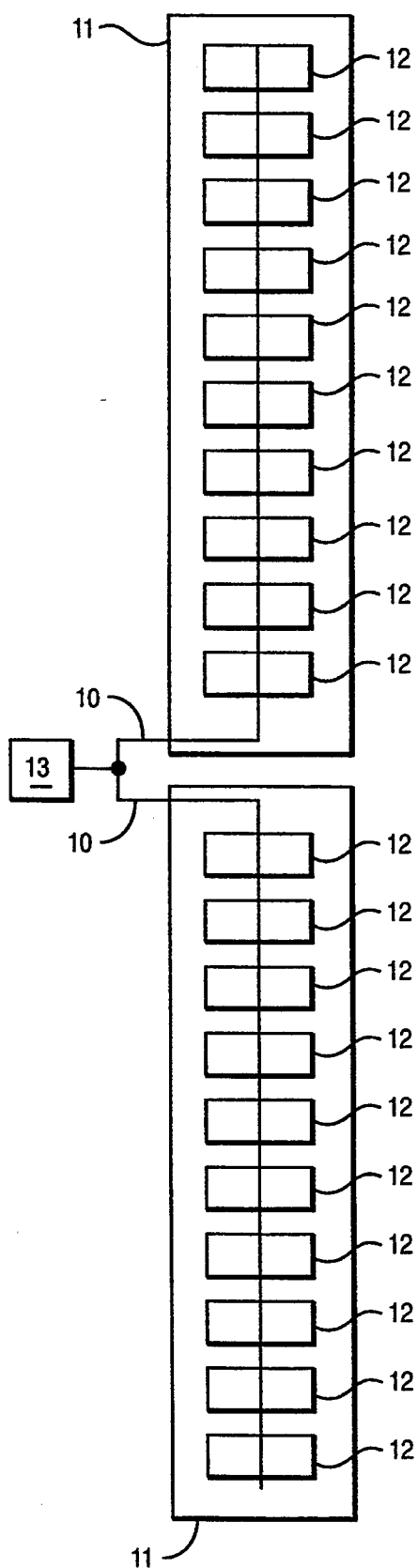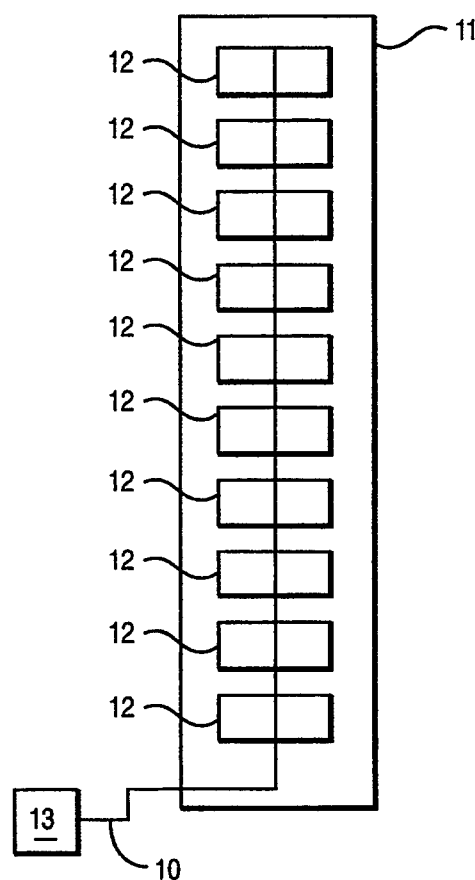
FIG. 1b
FIG. 1a
PRIOR ART

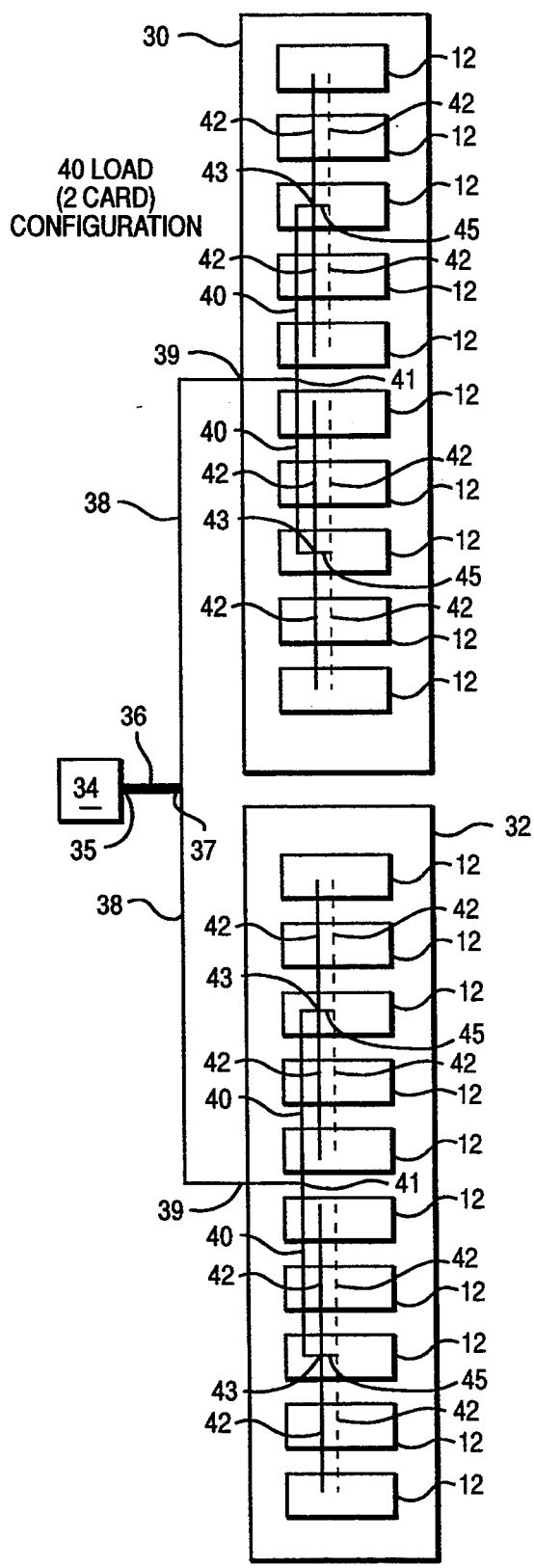
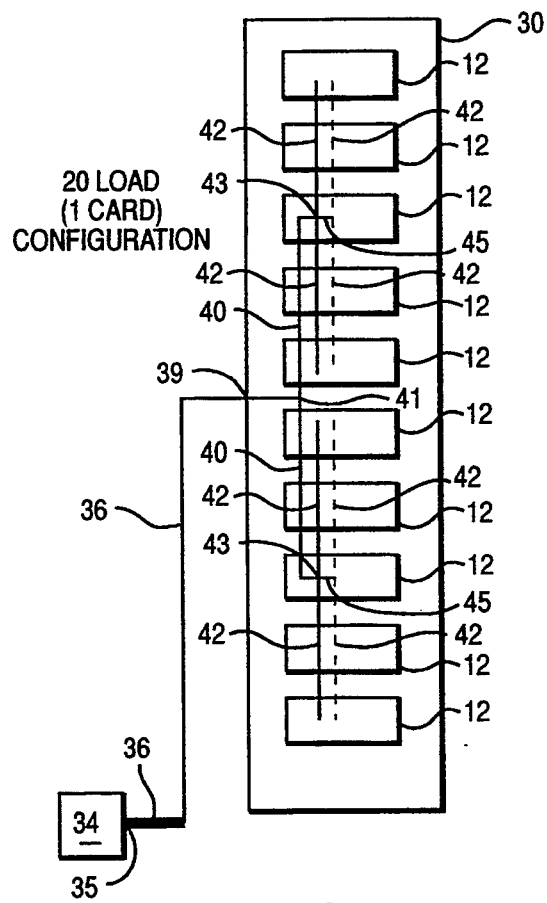
WIDE LINE => LOW IMPEDANCE
DOTTED LINE => BACK OF CARD
FIG. 3a
FIG. 3b

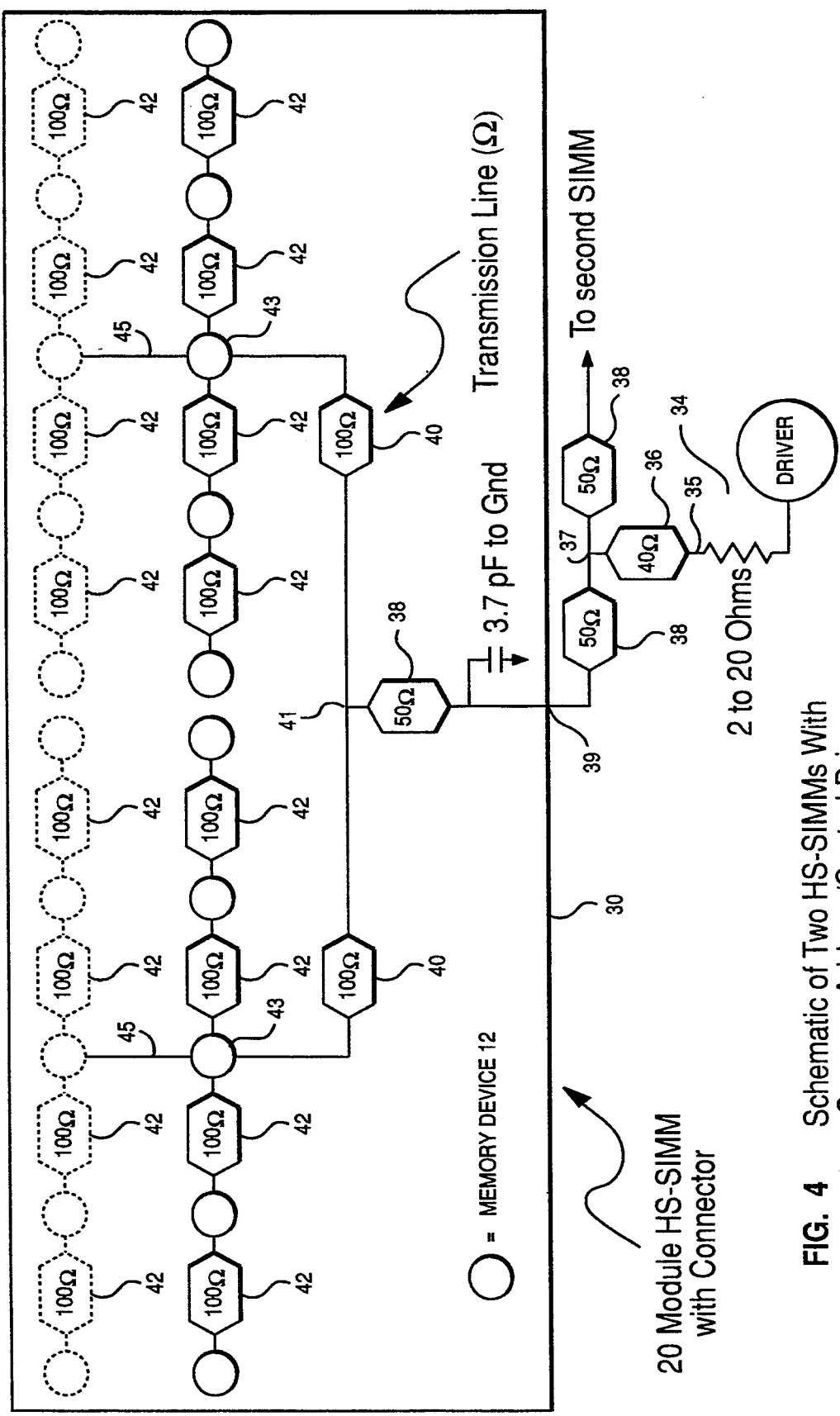
FIG. 4 Schematic of Two HS-SIMMs With Common Address/Control Driver

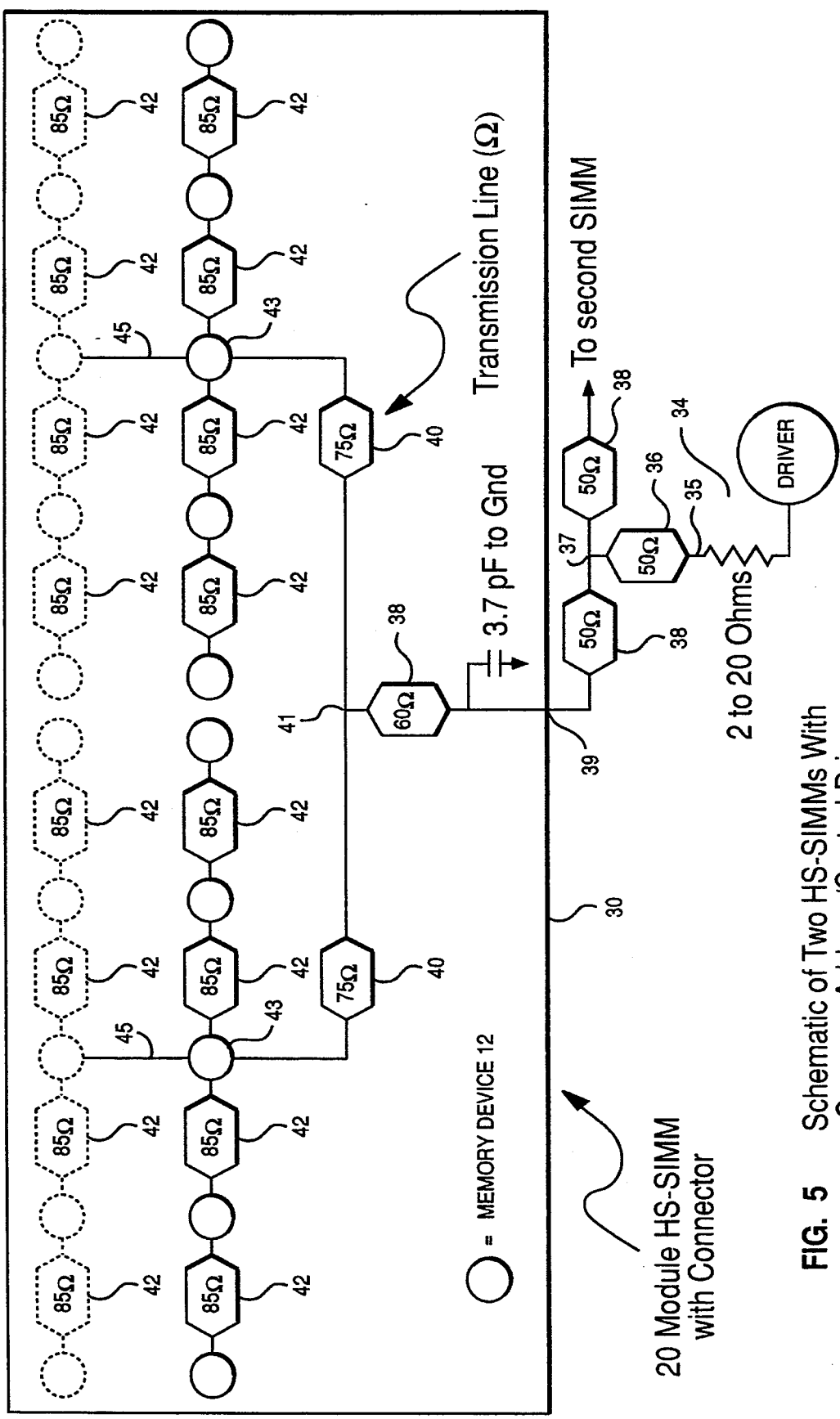
FIG. 5  Schematic of Two HS-SIMMs With Common Address/Control Driver

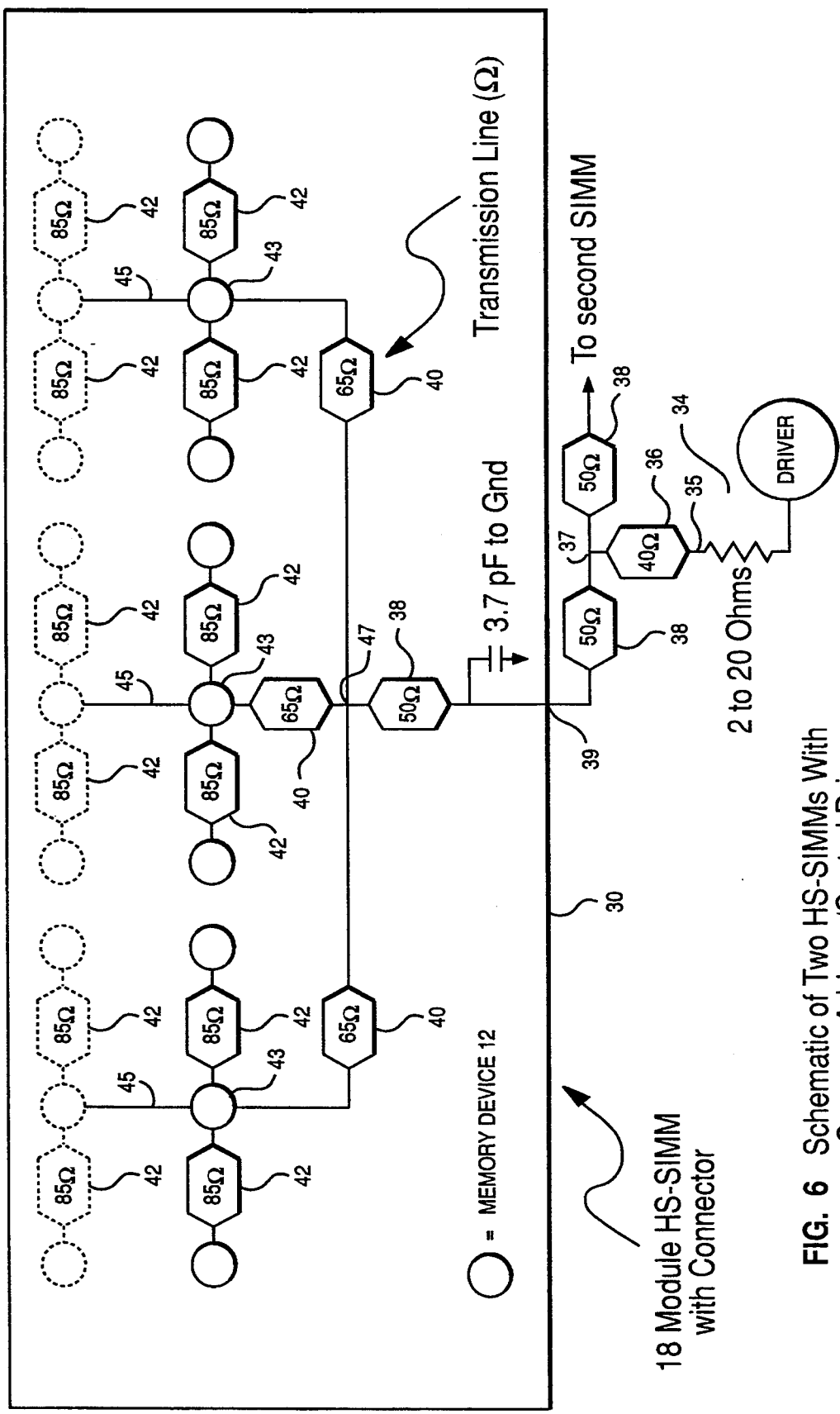
FIG. 6 Schematic of Two HS-SIMMs With Common Address/Control Driver ions (receivers). This arrangement gives smooth signal shapes for signal rise and fall times as fast as one (1) nsec or faster. The design uses a balanced multi-way branched net with increasing impedance until very close to the end of the net, where it is a balanced multi-way branched net with unterminated ends. Thus, coming out of the signal driver is a single impedance transmission line. This single impedance transmission line (A) then branches into two or more impedance transmission lines (B), each having an impedance higher than the single line impedance that feeds it. These lines (B) are used to drive electronic modules. After entering the electronic modules through a connector, each of these
WIRING TOPOLOGY FOR TRANSFER OF ELECTRICAL SIGNALS

TECHNICAL FIELD

The present invention relates to data processing systems, and more particularly to an improved method and apparatus for interconnection between electrical and electronic devices to improve signal propagation and quality.

BACKGROUND OF THE INVENTION

Electronic cards used within a data processing system require precise control of address, data and control signals (and in some cases clocks) for optimal performance. These signals are generated by electronic devices (e.g. semiconductor chips) accessing the contents of other semiconductor devices (e.g. memory chips) contained on the electronic cards. As the rise and fall times of these generated signals decreases to one (1) nanosecond (nsec) and below, the arrangement of circuit board traces and semiconductor devices on the electronic card strongly influences the shape of the signal presented to the semiconductor device. In most arrangements, the sharply changing voltages cause severe fluctuations on the signals as received by the semiconductor devices. The fluctuations can result in improper access to stored data, for example, causing errors in high speed computers, or resulting in lower performance.

The root cause of these signal fluctuations can usually be traced to the reflections of the signal pulses at the ends of the unterminated circuit board lines. The inductances and capacitances of the modules and connectors in the system can also contribute to the fluctuations, as well as mismatches between the impedances of the signal drivers and the signal traces. It is known that these fluctuations can be reduced by proper resistive termination of the circuit lines of the memory card, but this results in very large and undesirable power dissipation.

Other attempts at improving signal quality in high speed data processing systems are focussed on designs that minimize wire lengths. However, these types of designs are problematic in that the total path lengths from driver to (multiple) receivers are still longer than the signal rise times, and thus reflections from impedance discontinuities generally give rise to undesired signal distortions at the receiver(s).

SUMMARY OF THE INVENTION

The present invention provides an improved wiring topology and hierarchy of transmission line impedances for connecting common I/O of semiconductor devices together. The design is particularly useful for net topologies having a source (a driver) and multiple destinations (receivers). This arrangement gives smooth signal shapes for signal rise and fall times as fast as one (1) nsec or faster. The design uses a balanced multi-way branched net with increasing impedance until very close to the end of the net, where it is a balanced multi-way branched net with unterminated ends. Thus, coming out of the signal driver is a single impedance transmission line. This single impedance transmission line (A) then branches into two or more impedance transmission lines (B), each having an impedance higher than the single line impedance that feeds it. These lines (B) are used to drive electronic modules. After entering the electronic modules through a connector, each of these lines (B) then branch into two or more transmission lines (C) having a yet higher impedance value. Each of these lines (C) finally ends in a cluster of two or more transmission lines (D). Each of these final lines (D) connects to electronic devices on the electronic module.

It is therefore an object of the present invention to provide an improved high speed data processing system.

It is yet another object of the present invention to provide improved signal quality in a high speed data transmission system.

It is still another object of the present invention to provide a hierarchical wiring topology for transmission of data between electronic cards and/or devices.

These, and other, objects and advantages of the present invention will now be described, with reference to the following drawing, in which:

BRIEF DESCRIPTION OF THE DRAWINGS

FIGS. 1a–1b show a typical wiring net using minimum wire lengths, with FIG. 1a being a top view of two single in line modules (SIMMs) side-by-side, and FIG. 1b being top view of a single SIMM.

FIGS. 3a–3b depict wiring nets for a SIMM, in both a two card and one card embodiment.

FIG. 4 is an electrical schematic representation of the wiring nets for a high speed single inline memory module.

FIG. 5 is an electrical schematic of an alternative embodiment of the SIMM having differing impedance values.

FIG. 6 is an electrical schematic of an alternative embodiment of a SIMM having intermixed branch types.

DETAILED DESCRIPTION OF THE PREFERRED EMBODIMENT

Figure 2A:
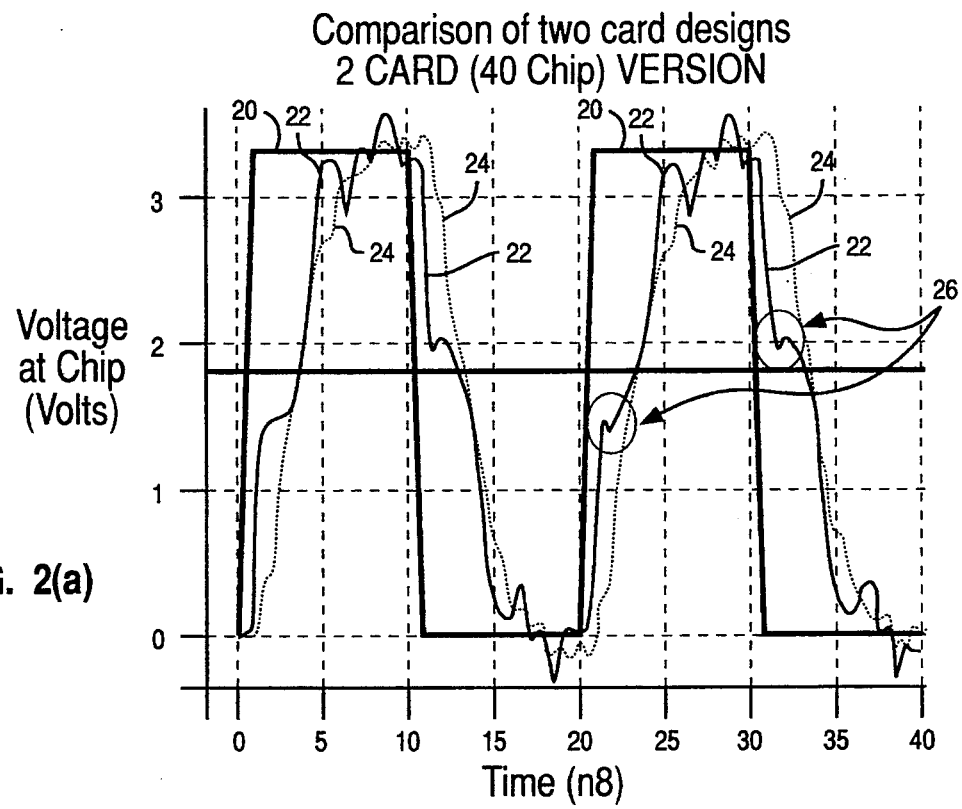
FIGS. 2a–2b shows simulated signal waveforms.

FIG. 1a shows an arrangement of circuit lines 10 and components 11 that actually result in low/minimum wire length, and thus in principle should be a good (fast) design. In this case, memory devices 12 on either side of the card (back side devices not shown) are connected together with vias to a common bus. All wiring is comprised of constant impedance (e.g. 50 ohm) transmission lines, which is typical in the industry. A driver 13 generates signals that traverse along the transmission line/wiring nets 10 to the memory devices 12. For example, line 10 could be used to transmit signals for a particular address bit value, or for a particular control bit value. Since line 10 goes to multiple memory devices, it is considered a common I/O for such memory devices.

FIG. 1b shows an one (1) card configuration having a total of twenty (20) memory devices. The ten (10) memory devices on the back side are not shown.

Figure 2B:
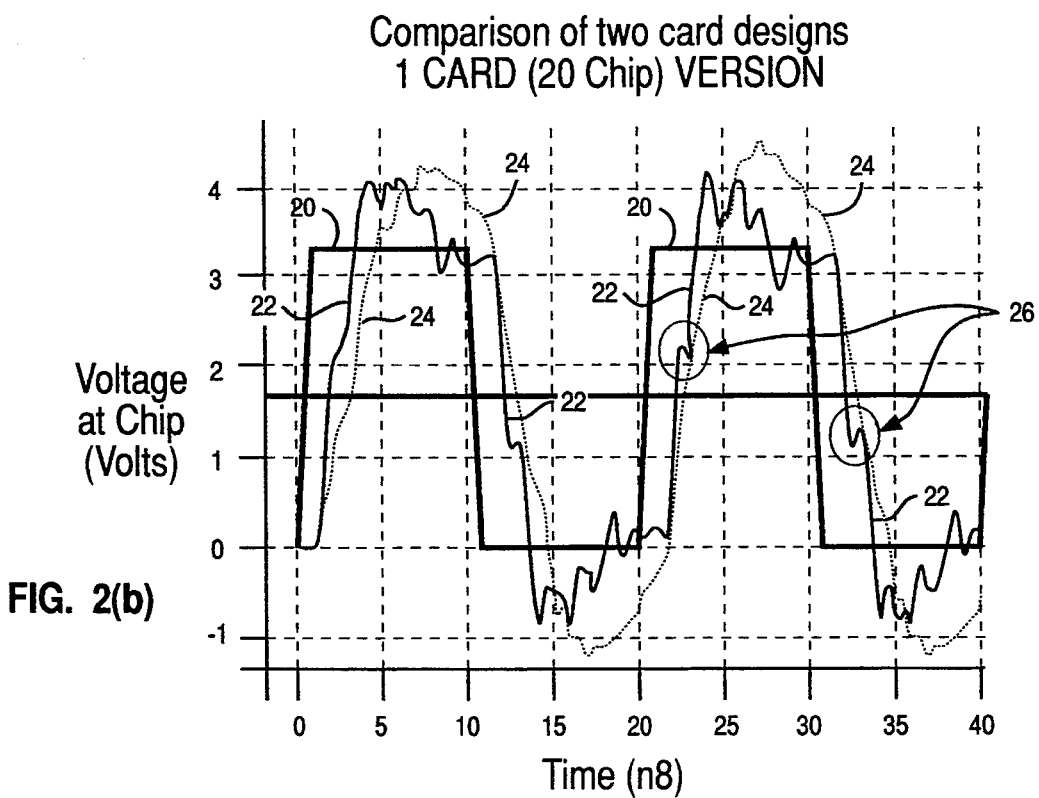

FIGS. 2a and 2b, which includes a simulation of the design of FIGS. 1a and 1b, respectively, shows that this typical design is not well behaved at fast signal speeds. There are three waveforms shown in each of FIGS. 2a and 2b. The smooth nearly square pulse 20 describes the one (1) nsec rise time signal from the driver 13. The wildly oscillating signal 22 (which is depicted with a solid line) describes the driver signal as received by the memory chips 12, in this particular case the third chip from the top in FIG. 1a and 1b. The behavior of the signal at the midpoint of the two voltage extremes (about 1.7 Volts) is critical. If the undulations of the signal are such that this midpoint is crossed repeatedly, then the circuit could trigger multiple times, or an erroneous signal could be recorded. One problem area is circled at 26 on FIG. 2a, and makes this design unusable. The third signal waveform 24 in FIGS. 2a and 2b (which is depicted with a dotted line), will be described later.

The present invention provides an arrangement of memory devices and circuit board traces/wiring nets that allows for fast rise and fall time pulses to be used to access the memory devices, without use of termination. Additionally, this arrangement allows the use of low impedance signal drivers, for maximum energy transfer to the memory devices. This design could similarly be used in any type of system requiring the transmission of data at high speeds.

FIG. 3a depicts the preferred embodiment of the present invention, which shows two memory cards 30 and 32, and a driving circuit 34. The memory cards are examples of SIMMs (single inline memory modules) constructed of memory chips 12 mounted on a circuit card 30 or 32. These memory cards are a common form of memory for personal computers.

The two SIMM design in FIG. 3a uses a balanced two-way branched net with increasing impedance, until very close to the end of the net, where it is a balanced four-way branched net with unterminated ends. Thus, coming out of the driver at point 35 is a single 40 ohm impedance transmission line 36 which then branches at point 37 into two 50 ohm impedance transmission lines 38 which drive each of the two SIMMs 30 and 32. After entering the SIMM at point 39 through a connector, each of these two 50 ohm lines then branches at point 41 into two 100 ohm transmission lines 40. Each of these 100 ohm lines 40 finally ends at point 43 in a cluster of four 100 ohm transmission lines, labeled 42. It is important that the point 43 is at, or near, the midpoint of the lines 42. Each of these final lines 42 connects to one of the five memory devices (two to the left of the connection point 43, two to the right of the connection point 43, and one close to the connection point 43). Note that two of the four lines 42 that make up a cluster are actually on the back side of the circuit card and are shown as dotted lines. They connect to memory devices located on the back of the circuit card (not shown). A conductive via 45 is used in the circuit card to route these two backside cluster lines to the back of the circuit card. Since the transmit through the via is very short with respect to the risetime of the pulse going through it, the only critical element for the via is that the capacitance be kept to a minimum. Thus, the vias 45 should be small in diameter (12 mil in the preferred embodiment), and have a symmetrical pattern with respect to the center of the card. In this case, the capacitance of the via is small with respect to the capacitance of the stub connected to it, and can be neglected. The key to the invention is not to avoid reflections at every discontinuity, but rather keeping the magnitude of the reflections small (by grading the impedance and keeping the stub length short), and then further degrading their effects of the reflections by using symmetrical nets.

The changes in impedance to the wiring nets is accomplished by varying techniques. The width of the nets can be varied using traditional techniques known in the art, such as photo-etching or lithographically controlled metal etching or metal deposition. Secondly, the height of the line above (or below or between) a reference plane(s) may be varied by appropriate choice of dielectric film thickness. Thirdly, reference lines may be run adjacent the signal lines, in the same plane. Lastly, the dielectric constant of the media itself may be changed.

FIG. 4 shows a schematic of two SIMMs (the second SIMM being identical to the first SIMM actually depicted in the figure), and a driver for driving a common address or control signal. The driver 34 has a impedance value of between 2-20 ohms. The driver 34 attaches at 35 to a single 40 ohm impedance line 36. This 40 ohm impedance line branches at 37 into two 50 ohm impedance lines at 38. This 50 ohm impedance line enters the SIMM via a high speed connect or at 39. The high speed connector 39 introduces a slight impedance mismatch by introducing a 3.7 pF capacitance. The 50 ohm impedance line 38 continues on the circuit card, where it branches at 41 into two 100 ohm transmission lines 40. Each of these 100 ohm lines finally ends at point 43 in a cluster of four 100 ohm transmission lines 42. Each of these final lines 42 connects to the respective memory devices 12. The devices 12 on the front side of the card are indicated by solid circles, and the devices 12 on the back side of the card are indicated be dashed circles. Via 45 electrically interconnects the front and back sides of the SIMM 30.

It is convenient to use different memory devices on the front and back surfaces of the card, such that the leads directly opposite each other have the same function. For example, so called normal leaded devices can be placed to the left of center on the front surface, and so called reverse leaded devices placed to the right of center on the front surface. This makes wiring the front surface of the card symmetric about the center. On the back surface the reverse configuration is used. Reverse leaded devices can be placed to the right of center and normal leaded devices to the left of center. Thus, the front and back surface wiring can overlay each other. It is common in the industry for memory devices to be available in both normal and reverse leaded modules.

Another form of the preferred implementation can be used to drive a single circuit card, as shown in FIG. 3b. In this case the first branch is missing. The simulation waveforms for the design of FIGS. 3a and 3b are shown at 24 in FIGS. 2a and 2b. Again, this design shows a smoothly varying waveform without level crossing of the midpoint voltage.

The specific values of the transmission lines, i.e., 40, 50, and 100 ohms, are tuned to the impedances of the drivers and the available circuit card technologies. They may be changed for other applications. For example, as shown in FIG. 5, the 100 ohm line 42 of FIG. 4 can be lowered to 85 ohms. The 40 ohm line 36 of FIG. 4 may be raised to 50 ohms without much change. The 50 ohm line 38 of FIG. 4 may be raised to 60 ohms to match the SIMM wiring, in an attempt to smoothly vary the impedance from the low value of the source resistance 34 (2-20 ohms), to a higher value on the circuit card (60 ohms). Making several small transitions in impedance is better than making a single large transition. By changing the line impedance at the circuit card connector to 60 ohms, the number of subsequent nodes needed to increase the impedance, to match the SIMM impedance, is reduced. What is important is the topology, i.e., two-way branches until a final four-way cluster, and that the impedances are roughly in ascending order. The ascending order can occur at a branch, or along a point to point connection.

The described topology is appropriate for a ten (10) or twenty (20) module SIMM. Similar topologies can be constructed for other numbers of modules. For example, a nine (9) module SIMM might use three (3) clusters of three (3) modules each, again with branched, symmetrical wiring and ascending impedances. An eighteen (18) module SIMM is possible by extending this three cluster technique to have modules on both sides of the SIMM, as shown in FIG. 6.

FIG. 6 also shows that it is possible to intermix the branch types. For example, this design can intermix a two-way branch with a three way branch. FIG. 6 shows a two-way branch at 37, a three way branch at 47, and four-way branch at 43. Nor is the particular order of the branch types critical. For example, a two-way branch could feed a four-way branch, and this four-way branch subsequently interconnects to a three-way branch. The key to the invention is to keep the magnitude of the reflections small, by grading the impedance and keeping the stub length short, and then further degrading the effects of the reflections by using symmetrical nets.

For what follows, it is necessary to understand the concept of regular and reverse leaded packages. A reverse leaded device such as a gull wing plastic package can be constructed from a regular leaded device by bending the leads of the gull wing up rather than down. The geometry is such that a regular leaded package on the top of a circuit card matches lead for lead with a reverse leaded-package on the bottom of the circuit card. With this in mind, we note that an alternative design for the circuit of FIGS. 1a and 1b can be constructed by alternating regular and reverse leaded devices on the top surface of the card, symmetrically arranged about the center. Beneath the card (on the bottom surface), we place alternately reverse and regular leaded packages, so that a reverse leaded package is beneath a regular leaded package, and vice-versa. In such a case, each line 42 would be tied to memory devices at only 3 points, with the center point and one of the end points each tied to adjacent memory devices and the other end point tied to a single memory device. This is not quite as balanced as the first case described and does not have quite as good an immunity to voltage fluctuations due to fast risetimes, but has other positive features, such as a simplicity in wiring from one chip to the next, that may make it more desirable in some situations.

Yet another design may be constructed by eliminating the dotted transmission lines 42 (FIGS. 4–6) and directly connecting devices on the top and bottom surfaces with conducting vias. This two-way terminating cluster again does not have as good animmunity to high speed ringing, but may be useful in that it has less circuit board wiring and thus lower overall capacitance.

As shown in FIG. 2a, the third waveform 24 (resulting from a design using the present invention) is much smoother, and free of crossings near the midpoint voltage. Both, designs (the balanced and the minimum wire) reach the midpoint voltage at the same time, i.e., they are the same speed. This is in spite of the fact that the balanced, increasing impedance design has more wiring and hence more capacitance.

In summary, we have described a wiring topology and hierarchy of transmission line impedances for connecting common I/O of semiconductor devices together. The optimal topology is two, two-way branches with ascending impedance, followed by a final four-way unterminated branch which contains the devices. This arrangement gives smooth signal shapes for signal rise and fall times of one (1) nsec or less.

While the invention has been shown and described with reference to particular embodiments thereof, it will be understood by those skilled in the art that the foregoing and other changes in form and detail may be made therein without departing from the spirit and scope of the invention.

We claim:

1. A wiring topology having a hierarchy of transmission line impedances for interconnecting devices, said wiring topology comprising:
    an input impedance network having a first impedance;
    a first branch network, connected to said input impedence network, comprising two portions, each of said two portions having an impedance greater than said input network; and
    a second branch network which attaches to said devices, and is connected to at least one of said portions of said first branch network, comprising four portions, each of said four portions having an impedance greater than each of said two portions.

2. The wiring topology of claim 1 wherein said second branch network is unterminated.

3. The wiring topology of claim 1 wherein said devices are semiconductor devices.

4. The wiring topology of claim 1 wherein the line impedances transfer address, control or clock signals for a memory device.

5. An electronic card comprising a wiring topology having a hierarchy of transmission line impedances for connecting semiconductor devices together, said wiring topology comprising:
    an input net having a first impedance;
    a first branch network, connected to said input net, comprising two portions, each of said two portions having an impedance greater than said input net; and
    a second branch network connected to at least one of said portions of said first branch network, comprising four portions, each of said four portions having an impedance greater than each of said two portions.

6. The electronic card of claim 5 wherein said second branch network is unterminated.

7. The electronic card of claim 5 wherein the line impedances transfer address, control or clock signals for a memory device.

* * * * *